United States Patent
Hummler

(10) Patent No.: US 6,740,558 B1
(45) Date of Patent: May 25, 2004

(54) SIGE VERTICAL GATE CONTACT FOR GATE CONDUCTOR POST ETCH TREATMENT

(75) Inventor: Klaus Hummler, Apex, NC (US)

(73) Assignee: Infineon Technologies AB (DE)

( * ) Notice: Subject to any disclaimer, the term of this patent is extended or adjusted under 35 U.S.C. 154(b) by 0 days.

(21) Appl. No.: 10/298,717

(22) Filed: Nov. 18, 2002

(51) Int. Cl.[7] .............................................. H01L 21/336
(52) U.S. Cl. .................... 438/268; 438/739; 438/752
(58) Field of Search ................................ 438/209, 212, 438/229, 230, 268, 739, 752, 791

(56) References Cited

U.S. PATENT DOCUMENTS 5,670,412 A * 9/1997 Juengling ................... 438/439
6,271,144 B1 * 8/2001 Monget et al. ............. 438/706
6,573,136 B1 * 6/2003 Hummler ..................... 438/242
6,617,213 B2 * 9/2003 Hummler ..................... 438/270

* cited by examiner

*Primary Examiner*—Michael Trinh
*Assistant Examiner*—Jamie L. Brophy

(57) ABSTRACT

There is provided a method for forming a vertical gate on a vertical array semiconductor device having support devices. The method includes the step of forming a pedestal of the vertical gate from SiGe. The pedestal is etched in a gate conductor (GC) post etch treatment (PET) that is selective with respect to the support devices. A trench top nitride spacer process is performed to obtain a GC SiN spacer combined with a DT (deep trench) top SiN spacer, wherein the GC SiN spacer and the DT top SiN spacer isolate a bitline contact from the vertical gate with respect to critical dimension and overlay.

2 Claims, 6 Drawing Sheets

SIGE VERTICAL GATE CONTACT FOR GATE CONDUCTOR POST ETCH TREATMENT

BACKGROUND

1. Technical Field

The present invention generally relates to semiconductor devices and, in particular, to a SiGe vertical gate contact for a gate conductor (GC) Post Etch Treatment (PET).

2. Background Description

In a vertical array device DRAM process a GC etch can remove excess vertical gate material to avoid shorts between word and bitlines. A PET acting to remove GC poly is problematic because the support devices/structures (hereinafter interchangeably referred to as "support structures" and "support devices") are also exposed and, thus, would be negatively affected. As is known, the support structures are devices and/or structures that support the memory portion (e.g., transistors) of a semiconductor memory device.

FIGS. 1A and 1B are diagrams of a vertical gate that illustrate the problem with residues in the "traditional" vertical gate process with trench top spacer. Note that in FIGS. 1A and 1B, the vertical gate (108 and 109) is formed of vertical gate pedestal 109 and vertical gate area 108. The GC etch would be required to etch excess pedestal material out of a box 101 that is formed by the GC edge 102, the trench top nitride spacer 103 and the two sides 104, 105 bordering on isolation trench (IT) 106. The GC etch may leave poly-Si residues on the sidewalls of this box 101 that can later cause shorts to the bitline contact 107. That is, the bitline contact 107 is likely to short to the vertical gate (108 and 109); even more critical are the sides of the vertical gate pedestal 109 bordering on isolation trench (IT) 106 because these sidewalls are more vertical or even re-entrant.

Therefore, a need exists for a method of removing vertical gate residues in a vertical array without negatively affecting the support devices.

SUMMARY OF THE INVENTION

The problems stated above, as well as other related problems of the prior art, are solved by the present invention, a SiGe vertical gate contact for GC PET. The SiGe vertical gate contact allows for a PET step selective to support GC poly. Thus, the SiGe vertical gate contact advantageously removes vertical gate residues in a vertical array without negatively affecting the support devices.

According to an aspect of the present invention, there is provided a method for forming a vertical gate on a vertical array semiconductor device having support devices. The method comprises forming a deep trench top nitride spacer, forming a pedestal of the vertical gate from SiGe, and etching the pedestal in a gate conductor post etch treatment that is selective with respect to the support devices. The method further comprises forming a gate conductor SiN spacer, wherein the gate conductor SiN spacer and the deep trench top SiN spacer isolate a bitline contact from the vertical gate with respect to critical dimension and overlay.

According to another aspect of the present invention, the support devices are formed of poly Si.

According to yet another aspect of the present invention, there is provided a method for forming a vertical gate on a vertical array semiconductor device having support devices. The method comprises the step of forming the vertical gate from SiGe. The vertical gate is etched in a GC PET that is selective with respect to the support devices. An SiN GC spacer is folded back in a recess created by the GC PET to isolate a bitline contact from the vertical gate with respect to critical dimension and overlay.

According to still yet another aspect of the present invention, the support devices are formed of poly Si.

According to a further aspect of the present invention, the step of forming the vertical gate from SiGe eliminates any DT top spacer processing with respect to the vertical gate.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to a SiGe vertical gate contact for gate conductor (GC) Post Etch Treatment (PET). It should be understood that the elements shown in the figures may be implemented in various forms of hardware, software or combinations thereof. Preferably, these elements are implemented on one or more appropriately programmed general purpose digital computers having a processor and memory and input/output interfaces. These elements may also by implemented on specially designed chips or software modules to provide the functionality in accordance with the present invention.

Figure 1A:
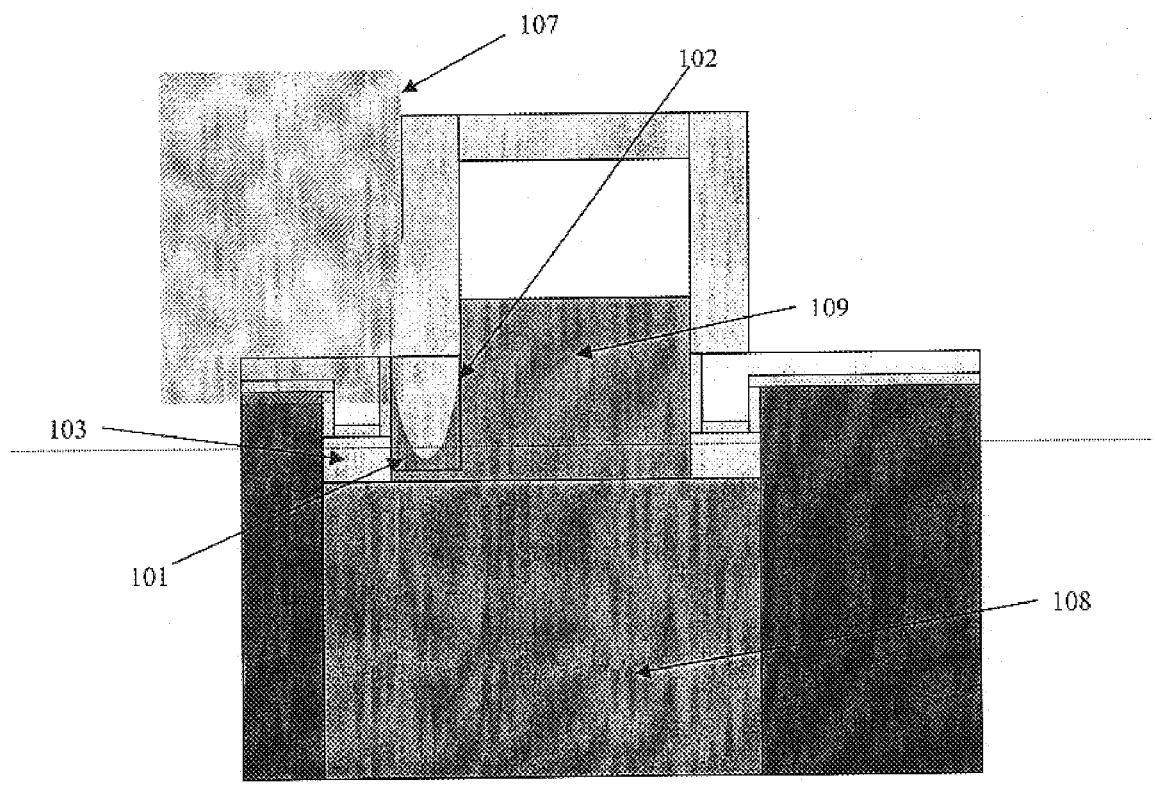
FIGS. 1A and 1B are diagrams of a vertical gate that illustrate the problem with residues in the "traditional" vertical gate process with trench top spacer.
Figure 1B:
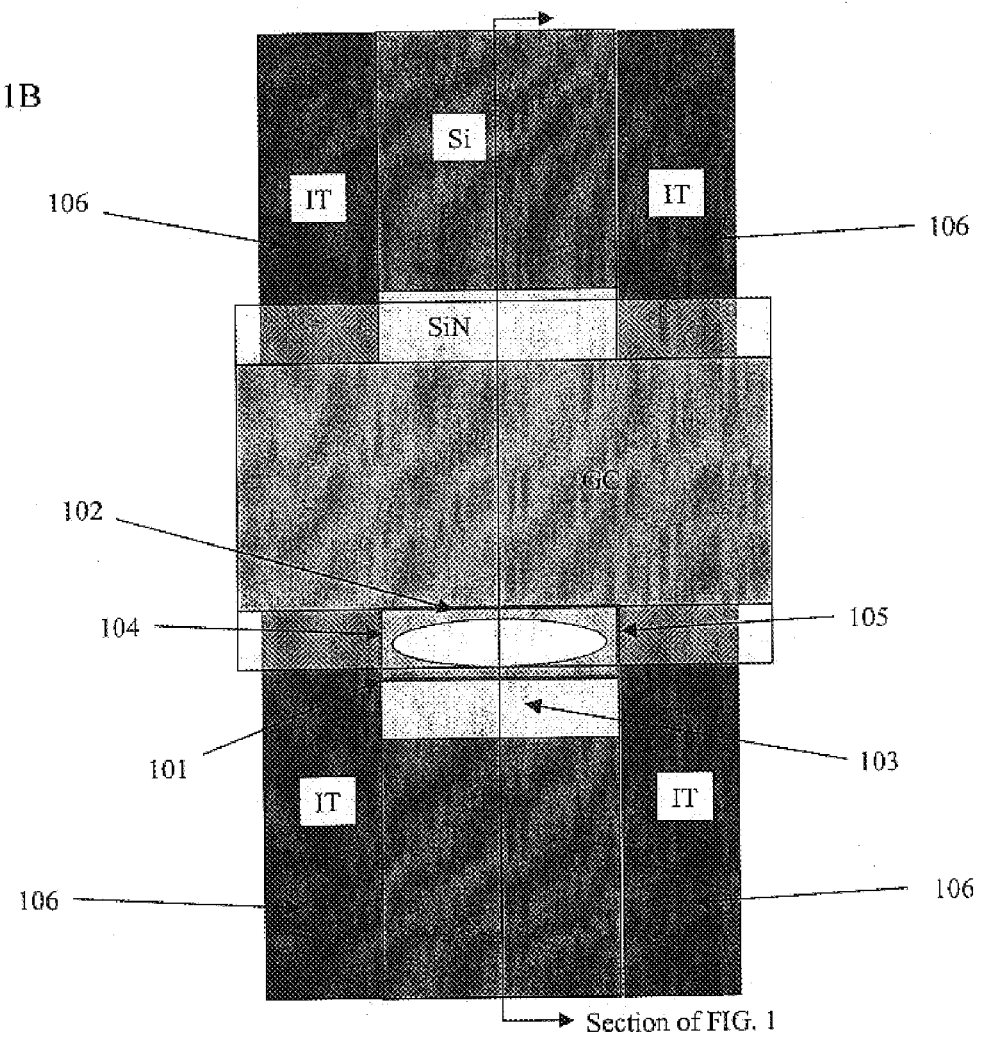
Figure 2:
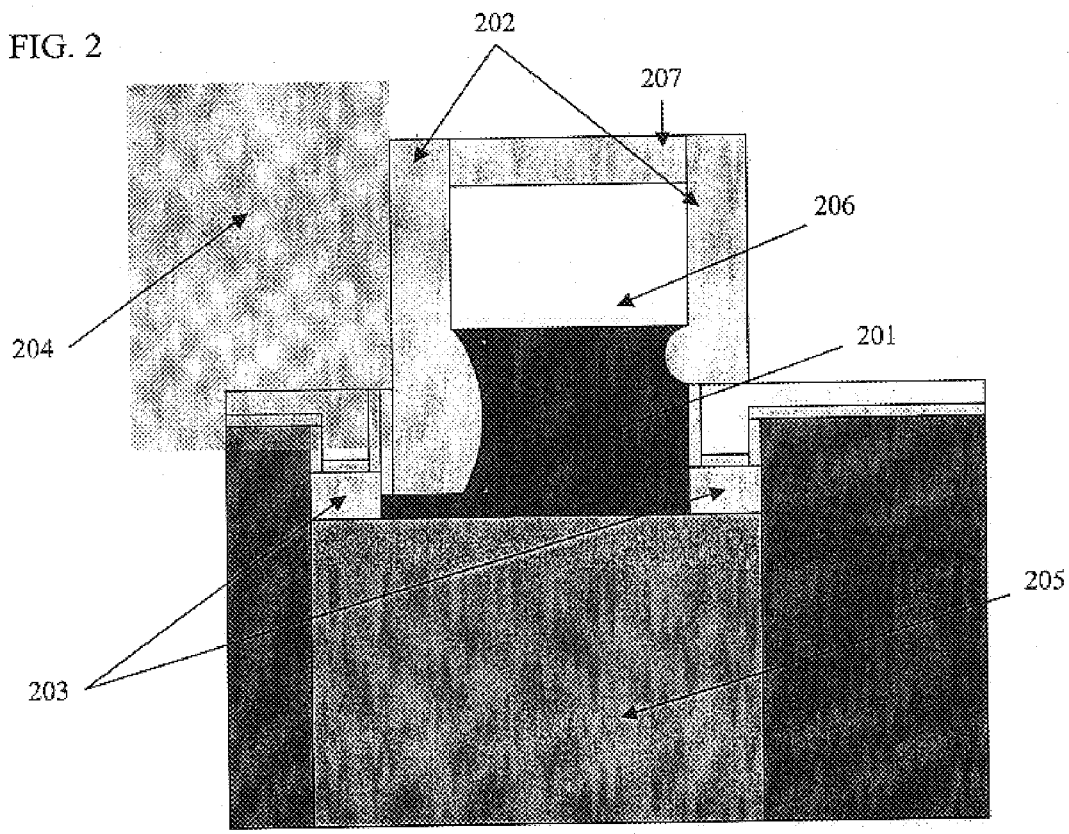
FIG. 2 is a diagram illustrating the use of SiGe for the vertical gate pedestal, according to an illustrative embodiment of the present invention.
Figure 3:
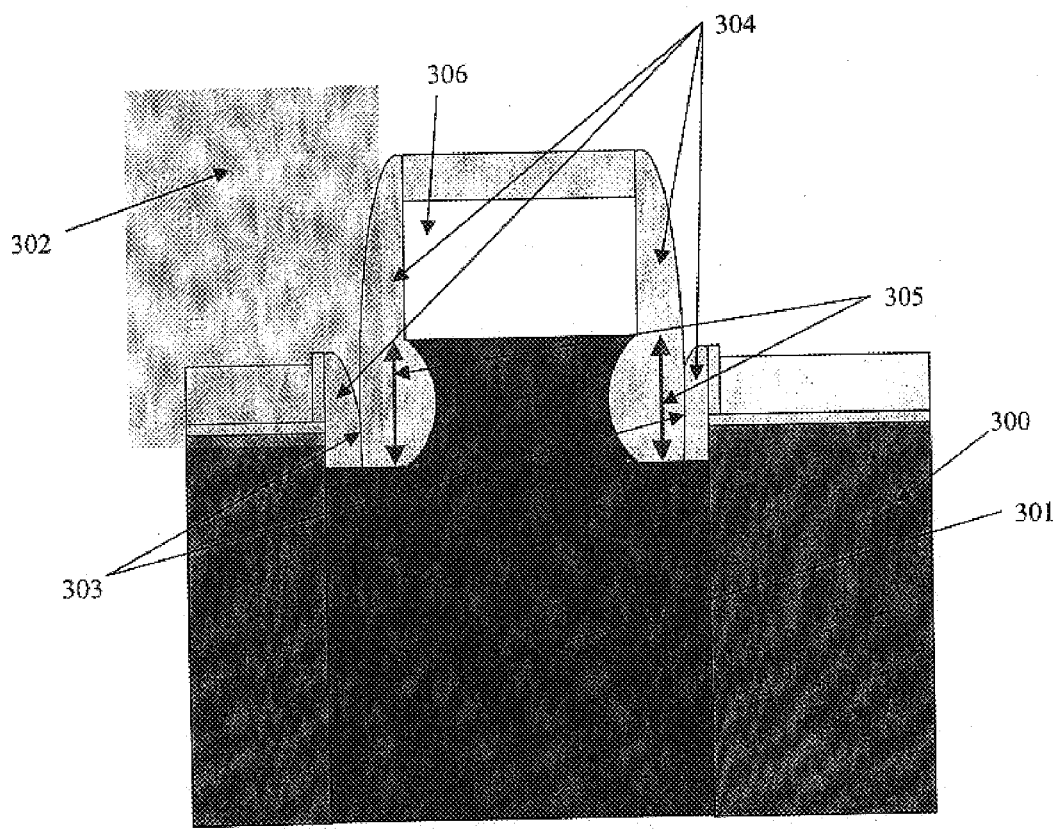
FIG. 3 is a diagram illustrating the use of SiGe for the complete vertical gate, according to an illustrative embodiment of the present invention.

FIG. 2 is a diagram illustrating the use of SiGe for the vertical gate pedestal, according to an illustrative embodiment of the present invention. FIG. 3 is a diagram illustrating the use of SiGe for the complete vertical gate, according to an illustrative embodiment of the present invention. It is to be appreciated that the embodiment of FIG. 2 is implemented in conjunction with a trench top nitride spacer process, while the embodiment of FIG. 3 is implemented without a trench top nitride spacer process.

The present invention describes the use of SiGe as pedestal or vertical gate material so that the vertical gate can be etched selectively with respect to the support devices (which are preferably made of poly Si). Etch chemistries that accomplish these tasks are known to those of ordinary skill in the related art and are also described by: Skotnicki et al., "Well-controlled, Selectively Under-etched Si/SiGe Gates for RF and High Performance CMOS", 2000 Symposium on VLSI Technology Digest of Technical Papers, p. 156, 2000; and Jurczak et al., "SON (Silicon On Nothing)—A New Device Architecture for the ULSI Era", 1999 Symposium on VLSI Technology Digest of Technical Papers, p. 29, 1999.

Note that in FIG. 2, the vertical gate (201 and 205) is formed of vertical gate pedestal 201 and vertical gate area 205. In the illustrative embodiment of FIG. 2, only the vertical gate pedestal 201 is made from SiGe, which allows for the removal of pedestal residues with a post GC etch treatment that is selective to the support devices (poly Si) and the virtual gate area 205. That is, the use of SiGe for the vertical gate pedestal 201 allows the vertical gate pedestal 201 to be etched in a post GC stack etch treatment that is selective with respect to the support devices (poly Si) and the virtual gate area 205. After the PET step, a GC SiN spacer 202 combined with a DT (deep trench) top SiN spacer 203 completely isolates a bitline contact 204 from the vertical gate (201 and 205). As is evident to one of ordinary skill in the related art, such isolation is achieved in all possible scenarios of critical dimension and overlay with respect to the GC SiN spacer 202 and the DT top SiN spacer 203. A GC line 206 is encapsulated by the GC SiN spacer 202 and a Nitride cap 207 deposited with a conducting layer.

In the illustrative embodiment of FIG. 3, a DT top SiN spacer process can be eliminated and the whole vertical gate 301 can be made with SiGe. This can simplify the process significantly and has only a minor impact on robustness against fluctuations in critical dimensions and overlay. The isolation from bitline 302 to vertical gate 301 would be accomplished with a fold back 303 of a SiN GC spacer 304 alone in the recess 305 created by the PET treatment acting on SiGe selective to support device gate poly SI.

Figure 4:
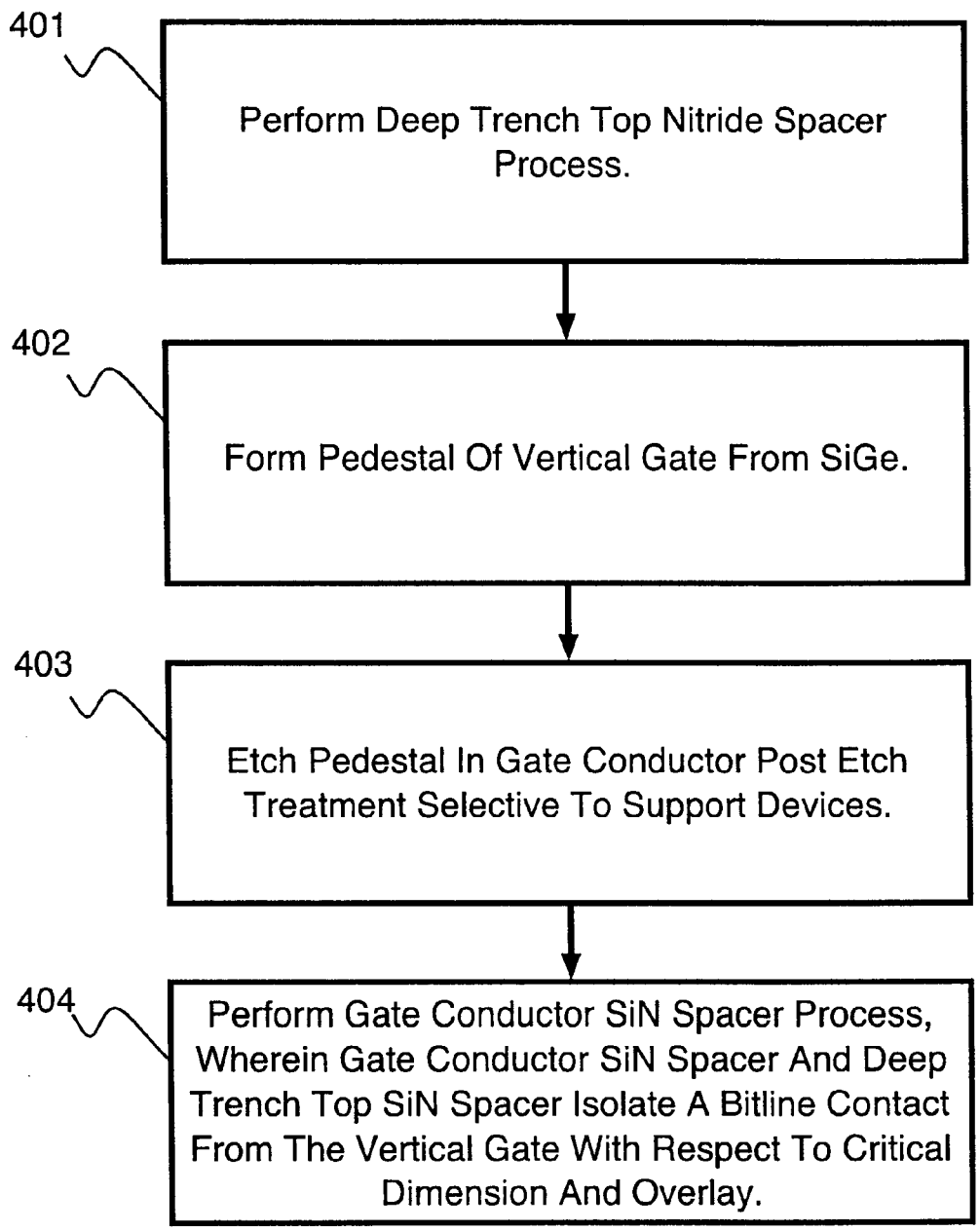
FIG. 4 is a flow diagram illustrating a method for forming a vertical gate contact on a vertical array semiconductor device having support devices, according to an illustrative embodiment of the present invention.

FIG. 4 is a flow diagram illustrating a method for forming a vertical gate contact on a vertical array semiconductor device having support devices, according to an illustrative embodiment of the present invention. The method of FIG. 4 corresponds to the gate contact shown in FIG. 2.

A DT top SiN spacer 203 can be formed in a top portion of a trench etched in a substrate (block 401). The DT top SiN spacer 203 can be formed by any conventional technique, for example, filling the trench, recessing the fill to a depth needed for the DT top SiN spacer, and forming the DT top SiN spacer. A pedestal 201 of the vertical gate (201 and 205) can be formed from SiGe (block 401) by filling the recess between the spacers. The device can be planarized to a pad nitride. The pedestal 201 can be etched in a GC PET that is selective with respect to the support devices (block 403). The support devices are preferably formed of poly Si. A GC SiN spacer 202 can be formed, wherein the GC SiN spacer 202 and the DT top SiN spacer 203 isolate a bitline contact 204 from the vertical gate (201 and 205) with respect to critical dimension and overlay (block 404). The process of forming the gate conductor SiN spacer can be done according to conventional techniques, for example, by conformal deposition of the spacer material and an applied n-isotopic etch to remove the material on the horizontal surfaces of the device.

Figure 5:
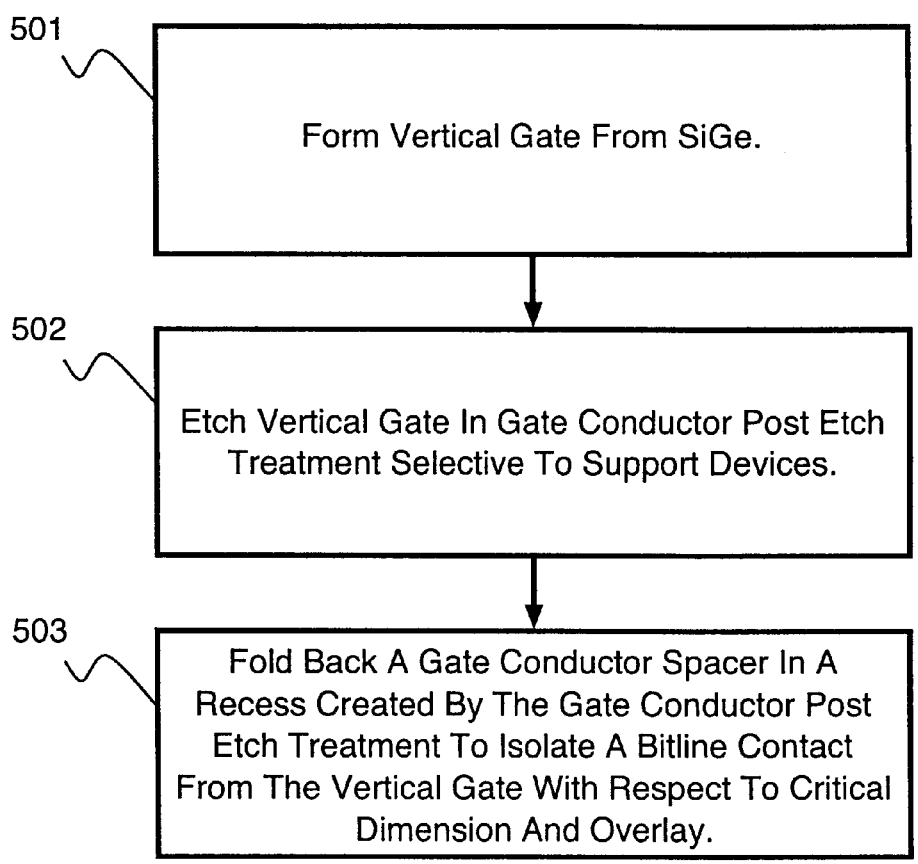
FIG. 5 is a flow diagram illustrating a method for forming a vertical gate contact on a vertical array semiconductor device having support devices, according to another illustrative embodiment of the present invention.

FIG. 5 is a flow diagram illustrating a method for forming a vertical gate contact on a vertical array semiconductor device having support devices, according to another illustrative embodiment of the present invention. The method of FIG. 5 corresponds to the gate contact shown in FIG. 3.

The vertical gate 301 is formed from SiGe (block 501). It is to be appreciated that the step of forming the vertical gate 301 from SiGe eliminates any DT top spacer processing with respect to the vertical gate 301. The vertical gate 301 can be etched in a gate conductor (GC) post etch treatment (PET) that is selective with respect to the support devices (block 502). The support devices are preferably formed of poly Si. A SiN GC spacer 304 can be folded back in a recess 305 created by the GC PET to isolate a bitline contact 302 from the vertical gate 301 with respect to critical dimension and overlay (block 503).

The GC material can be, for example, PolySi/metal stack. Other materials can be used for the GC, while maintaining the spirit and scope of the present invention.

Referring to FIG. 3, GC lines 306 can be patterned from the GC material so as to create a recess in a pedestal of the vertical gate (block 503). Block 530 can be performed using preferably an anisotropical etch. Other types of etching can be used to pattern the GC lines 306, while maintaining the spirit and scope of the present invention.

A GC PET can be applied that is selective with respect to the support devices, thus removing SiGe residues from the side walls A brief description will now be given of the SiN GC spacer. After the GC lines (206, 306) have been patterned a conformal SiN layer is deposited and then etched back with an an-isotropic etch. This etch removes the SiN on all horizontal surfaces but leaves SiN on the side of the GC lines. This SiN GC spacer is used to control implants and act as an etch stop for the bitline contact etch (oxide etch selective to SiN). The SiN GC spacer laterally isolates the bitline contact from the GC lines.

According to the present invention, the SiN GC spacer 304 fills the space between substrate 300 and the patterned GC line 306. The spacer etch will not remove all of that material and the remaining SiN again acts as an etch stop (this time a vertical etch stop) for the bitline contact etch, so that the bitline contact does not short to the vertical gate.

A brief description will now be given of the recess created by the GC PET. The recess which is filled in by the spacer SiN is generated by the GC etch (an-isotropic, used to pattern the lines) plus the PET treatment that will remove additional gate material (isotropic). Typically, the GC etch has sufficient over etch and selectivity with respect to SiO2 so that the support GC lines can be etched with vertical profiles and sufficient over etch into the vertical gate pedestal in the memory array can be guaranteed. Thus, the PET step really does not have to contribute much to the recess depth but has to ensure side walls free of gate material residue.

As described herein, if the GC over etch and PET can be sufficiently controlled, the DT top spacer could be eliminated. The minimum recess depth is given by the fact that sufficient spacer SiN needs to remain after the spacer etch in the hole, the upper limit is given by gate overlap for the vertical device (this can be controlled by the DT top spacer).

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A method for forming a vertical gate on a vertical array semiconductor device having support devices, the method comprising the steps of:

forming a deep trench top nitride spacer;

forming a pedestal of the vertical gate from SiGe;

etching the pedestal in a gate conductor post etch treatment that is selective with respect to the support devices; and forming a gate conductor SiN spacer, wherein the gate conductor SiN spacer and the deep trench top SiN spacer isolate a bitline contact from the vertical gate with respect to critical dimension and overlay.

2. The method of claim 1, wherein the support devices are formed of poly Si.

* * * * *